(12) United States Patent
Mueller et al.

(10) Patent No.: US 11,750,176 B2
(45) Date of Patent: Sep. 5, 2023

(54) REFLECTION ATTENUATION DEVICE FOR A BUS OF A BUS SYSTEM, AND METHOD FOR ATTENUATING REFLECTIONS DURING A DATA TRANSFER IN A BUS SYSTEM

(71) Applicant: Robert Bosch GmbH, Stuttgart (DE)

(72) Inventors: Andreas Mueller, Markgroeningen (DE); Simon Weissenmayer, Flein (DE); Steffen Walker, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 120 days.

(21) Appl. No.: 17/294,278

(22) PCT Filed: Nov. 13, 2019

(86) PCT No.: PCT/EP2019/081185
§ 371 (c)(1),
(2) Date: May 14, 2021

(87) PCT Pub. No.: WO2020/104275
PCT Pub. Date: May 28, 2020

(65) Prior Publication Data
US 2021/0409003 A1 Dec. 30, 2021

(30) Foreign Application Priority Data
Nov. 22, 2018 (DE) .......................... 102018220069.6

(51) Int. Cl.
*H03H 11/24* (2006.01)
*H04B 1/38* (2015.01)
*H04L 12/40* (2006.01)

(52) U.S. Cl.
CPC ............... *H03H 11/24* (2013.01); *H04B 1/38* (2013.01); *H04L 12/40* (2013.01); *H04L 2012/40273* (2013.01)

(58) Field of Classification Search
CPC .......... H03H 11/24; H04B 1/38; H04L 12/40; H04L 2012/40273; H04L 25/0278; H04L 25/0272; H04L 2012/40215
See application file for complete search history.

(56) References Cited

U.S. PATENT DOCUMENTS 6,405,330 B1 * 6/2002 Hanf ................. H04L 12/40006
714/712
10,592,458 B1 * 3/2020 Shi ...................... H04L 25/0298
(Continued)

FOREIGN PATENT DOCUMENTS

| DE | 10211834 A1 | 9/2003 |
|---|---|---|
| EP | 0364700 A2 | 4/1990 |
| EP | 0608305 B1 | 3/2000 |

OTHER PUBLICATIONS

International Search Report for PCT/EP2019/081185, dated Mar. 11, 2020.

*Primary Examiner* — Dac V Ha
(74) *Attorney, Agent, or Firm* — NORTON ROSE FULBRIGHT US LLP; Gerard Messina

(57) ABSTRACT

A reflection attenuation device for a bus of a bus system and a method for attenuating reflections during a data transfer in a bus system. The reflection attenuation device may close off a free end of bus lines of the bus in a transceiver device of a user station of the bus system. Alternatively, the reflection attenuation device may be connected to a branch point of the bus which is a star point or is used to connect a user station to the bus. Thus, bus users in a vehicle trailer are also connectable to the bus system of the vehicle, as needed. The reflection attenuation device includes at least one pair of (Continued)

electrical semiconductor components connected in parallel, and at least one capacitor that is connected in series to the pair of electrical semiconductor components connected in parallel, for attenuating reflections on a bus line of the bus.

12 Claims, 6 Drawing Sheets

(56) References Cited

U.S. PATENT DOCUMENTS

| | | | |
|---|---|---|---|
| 2018/0287816 A1* | 10/2018 | Osada | H04L 12/40006 |
| 2019/0028303 A1* | 1/2019 | Soraku | B60R 16/023 |
| 2021/0377060 A1* | 12/2021 | Muth | G06F 13/4072 |
| 2021/0400056 A1* | 12/2021 | Klösters | H04L 63/10 |

* cited by examiner

REFLECTION ATTENUATION DEVICE FOR A BUS OF A BUS SYSTEM, AND METHOD FOR ATTENUATING REFLECTIONS DURING A DATA TRANSFER IN A BUS SYSTEM

FIELD

The present invention relates to a reflection attenuation device for a bus of a bus system which in particular is a serial bus system, and a method for attenuating reflections during a data transfer in a bus system, in which a circuit including at least one capacitor and antiparallel diodes or transistors is used.

BACKGROUND INFORMATION

Between sensors and control units, for example in vehicles, more and more frequently a bus system is used in which data are transferred as messages under the ISO 11898-1:2015 standard, as a CAN protocol specification with CAN FD. The messages are transferred between the user stations of the bus system, such as the sensor, control unit, transducer, etc. In the introduction phase, at the present time in the first step CAN FD is generally used in the vehicle with a data bit rate of 2 Mbit/s for the transfer of bits of the data field, and with an arbitration bit rate of 500 kbit/s for the transfer of bits of the arbitration field.

The data transfer is greatly limited in bus systems due to the reflections at open bus ends, line branches, and plug-in connectors. In the bus system, two terminating resistors that are farthest apart from one another in the bus system are generally used at the user stations.

However, problems arise when such a termination of the bus is not possible, for example when a CAN user station is situated in a trailer, it being possible to operate the vehicle with or without a trailer. In this case, the trailer must be connected via a private CAN line, or great tradeoffs in the data rate must be accepted.

When all user stations are connected to one another in a star shape, a resistor is often mounted in the star point to attenuate the reflections in the bus system.

In a CAN bus system, in addition there is the requirement for the voltages on the bus to be limited to 0 V to 2 V due to differential voltage VDIFF on the bus. This may be achieved using a Zener diode, for example, which is connected to an externally supplied operational amplifier circuit that also protects the Zener diode from a short circuit of the bus lines. However, such a variant is quite complicated due to the required operational amplifier.

SUMMARY

An object of the present invention, therefore, is to provide a reflection attenuation device for a bus of a bus system, and a method for attenuating reflections during a data transfer in a bus system which solve the above-mentioned problems. In particular, the intent is to provide a reflection attenuation device for a bus of a bus system and a method for attenuating reflections during a data transfer in a bus system in which the reflection attenuation may be optimized, even at high data rates.

The object may be achieved by a reflection attenuation device for a bus of a bus system in accordance with an example embodiment of the present invention. The reflection attenuation device includes at least one pair of electrical semiconductor components connected in parallel, and at least one capacitor, connected in series to the at least one pair of electrical semiconductor components connected in parallel, for attenuating reflections on a bus line of the bus.

The described reflection attenuation device generally does not have to be supplied with an external voltage, but in any case it is robust against short circuits and may limit the voltage very well to a range between 0 volt and 2 volts, for example, or some other desired voltage range. In addition, the described reflection attenuation device may have a particularly symmetrical design. As a result, the electrical circuit of the reflection attenuation device is particularly robust against common-mode interferences.

Due to the configuration of the described reflection attenuation device, there is more freedom in the design of a cable harness, in particular in a vehicle. Moreover, higher data transfer rates may be achieved with the described reflection attenuation device. The described reflection attenuation device allows good reflection suppression of high-frequency common-mode interferences to be achieved, even when the bit rate is increased compared to bus systems thus far.

As a result, the data rate in the bus system may be increased without appreciably impairing the communication due to line reflections.

The described reflection attenuation device thus ensures that in the bus system in which the reflection attenuation device is used, flexible use of in particular CAN FD or its successor communication types is possible at an even higher data transfer rate than with conventional CAN or CAN FD.

Advantageous further embodiments of the reflection attenuation device are described herein.

According to one exemplary embodiment of the present invention, a pair of electrical semiconductor components connected in parallel is connected between two capacitors.

According to one exemplary embodiment of the present invention, one capacitor is connected between two pairs of electrical semiconductor components connected in parallel.

According to one option of the present invention, the at least one pair of electrical semiconductor components connected in parallel includes two diodes connected antiparallel.

According to another option of the present invention, the at least one pair of electrical semiconductor components connected in parallel includes two transistors that are in particular connected antiparallel, the transistors being bipolar transistors in which in each case the base terminal and the collector terminal of one transistor are connected to the emitter terminal of the other transistor, or the transistors being field effect transistors in which in each case the gate terminal and the drain terminal of one transistor are connected to the source terminal of the other transistor.

The reflection attenuation device possibly also includes a voltage divider that is connected in parallel to the series connection of the at least one pair of electrical semiconductor components connected in parallel and the at least one capacitor, the voltage divider optionally being connected to a switching device for connecting or disconnecting the voltage divider.

It is possible for the voltage divider to include three resistors that are connected to one another in series, the middle resistor of the voltage divider being connected in parallel to the capacitor, the middle resistor having a resistance value that is approximately one-half the resistance value of the other two resistors of the voltage divider, and the resistance value of the middle resistor being greater than approximately 10 kohm or approximately 1 kohm.

The reflection attenuation device may also include at least one connectable voltage source that includes an impedance converter. It is possible for the impedance converter to include an operational amplifier at whose output a series connection of two diodes is connected, the series connection of two diodes being connected in parallel to the one capacitor.

The reflection attenuation device described above may be part of a user station for a bus system which also includes a transceiver device for transmitting messages onto a bus of the bus system and/or for receiving messages from the bus of the bus system. The reflection attenuation device may be integrated into the transceiver device.

The user station possibly also includes a communication control device for generating and transmitting messages to the transceiver device and for receiving and evaluating messages from the transceiver device, the communication control device being designed to generate the messages in such a way that in the first communication phase for transmitting the messages onto the bus, it is negotiated, between the user stations of the bus system, which of the user stations in the subsequent second communication phase has, at least temporarily, exclusive, collision-free access to the bus of the bus system.

At least two user stations may be part of a bus system that also includes a bus, so that the at least two user stations are connected to one another via the bus in such a way that they may communicate serially with one another. In addition, the bus system includes at least one reflection attenuation device described above for at least one bus line of the bus. The at least one reflection attenuation device may be connected to a branch point of the bus. Alternatively, the at least one reflection attenuation device may close off a free end of the bus. At least one of the at least two user stations is possibly a user station described above.

Moreover, the object may be achieved by a method for attenuating reflections during a data transfer in a bus system according to an example embodiment of the present invention. The method in accordance with an example embodiment of the present invention includes the steps: transmitting a message in the bus system via a bus, to whose at least one bus line a reflection attenuation device that includes at least one pair of electrical semiconductor components connected in parallel, and at least one capacitor, connected in series to the at least one pair of electrical semiconductor components connected in parallel, is connected, and attenuating reflections on a bus line of the bus, using the reflection attenuation device.

The method yields the same advantages as stated above with regard to the reflection attenuation device.

Further possible implementations of the present invention also include combinations, even if not explicitly stated, of features or specific embodiments described above or discussed below with regard to the exemplary embodiments. Those skilled in the art will also add individual aspects as enhancements or supplements to the particular basic form of the present invention, in view of the disclosure herein.

BRIEF DESCRIPTION OF THE DRAWINGS

The present invention is described in greater detail below with reference to the figures, and based on exemplary embodiments.

Unless stated otherwise, identical or functionally equivalent elements are provided with the same reference numerals in the figures.

DETAILED DESCRIPTION OF EXAMPLE EMBODIMENTS

Figure 1:
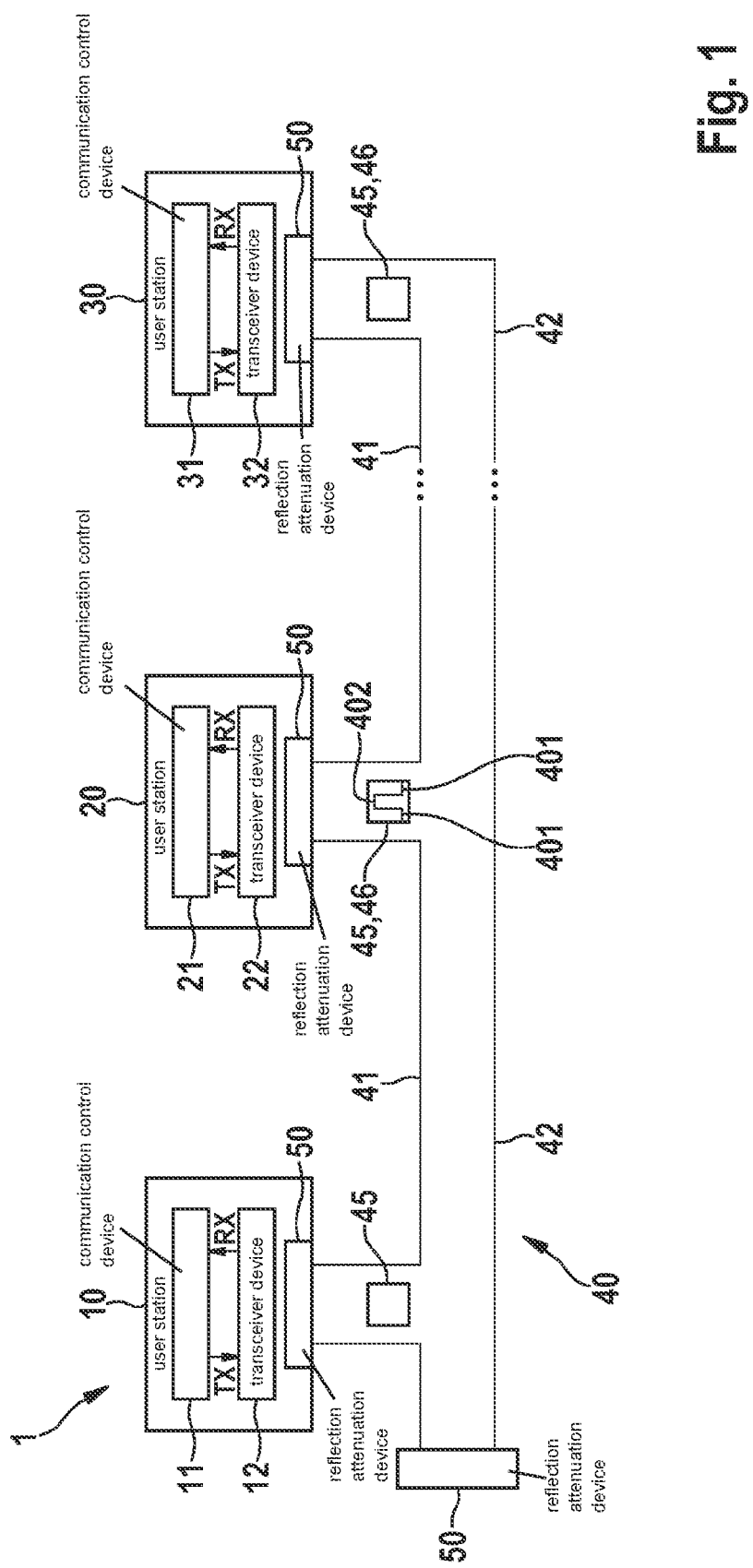
FIG. 1 shows a simplified block diagram of a bus system according to a first exemplary embodiment of the present invention.

FIG. 1 shows as an example a bus system 1 that is in particular the basis for the design of a conventional CAN bus system, a CAN FD bus system, or a CAN FD successor bus system, as described below. Bus system 1 may be used in a vehicle, in particular a motor vehicle, an aircraft, etc., or in a hospital, and so forth.

In FIG. 1, bus system 1 includes a plurality of user stations 10, 20, 30, each of which is connected to a bus 40 via a first bus line 41 and a second bus line 42. In the example in FIG. 1, bus 40 is closed off at multiple locations via a reflection attenuation device 50. Of these, a reflection attenuation device 50 is provided for user station 30. User stations 10, 20 are each connected to bus 40 via a stub, which likewise is closed off via a reflection attenuation device 50.

In particular, user stations 10, 20 are situated in a passenger car or truck, whereas user station 30 is accommodated in a trailer that is attached to the passenger car or truck as needed. Thus, user station 30 is also attached to bus system 1 only as needed.

Thus, in bus system 1 it is possible for at least one of user stations 10, 20, 30, or at least one user station in addition to user stations 10, 20, 30, to be connected to bus 40 or disconnected from bus 40 as needed.

Bus lines 41, 42 may also be referred to as CAN_H and CAN_L and, using a TX signal in the transmission state, are used for electrical signal transfer after coupling in the dominant levels or states 401, or generating or actively driving recessive levels or states 402. States 401, 402 are shown in a highly schematic manner only for user station 20. States 401, 402 correspond to the states of a TX signal of a transmitting user station 10, 20, 30. After signals CAN_H and CAN_L are transferred on bus lines 41, 42, the signals are received by user stations 10, 20, 30 as an RX signal. Via bus 40, messages 45, 46 in the form of signals CAN_H and CAN_L are serially transferable between individual user stations 10, 20, 30. A differential bus voltage VDIFF=CAN_H−CAN_L is computed from signals CAN_H and CAN_L on the two bus lines 41, 42. User stations 10, 20, 30 are, for example, control units, sensors, display devices, etc., of a motor vehicle.

As shown in FIG. 1, user station 10 includes a communication control device 11 and a transceiver device 12. User station 20 includes a communication control device 21 and a transceiver device 22. User station 30 includes a communication control device 31 and a transceiver device 32. Transceiver devices 12, 22, 32 of user stations 10, 20, 30 are each directly connected to bus 40, although this is not illustrated in FIG. 1. Transceiver devices 12, 22 are each connected to bus 40 via a stub.

Communication control devices 11, 21, 31 are each used for controlling a communication of particular user station 10, 20, 30 via bus 40 with one or multiple other user stations of user stations 10, 20, 30 connected to bus 40. Communication control devices 11, 21, 31 each generate a transmission signal, also referred to as a TX signal, for messages 45, 46 to be transmitted, and transmit the TX signal to associated transceiver device 12, 22, 32. In addition, particular communication control device 11, 21, 31 may receive and evaluate a reception signal, also referred to as an RX signal, from associated transceiver device 12, 22, 32 for message 45, 46 that is received from bus 40. In particular, communication control devices 11, 21, 31 may generate messages 45, 46 in such a way that in a first communication phase for transmitting messages 45, 46 onto bus 40, it is negotiated, between user stations 10, 20, 30, which of user stations 10, 20, 30 in the subsequent second communication phase has, at least temporarily, exclusive, collision-free access to bus 40 of bus system 1. In the second communication phase, the useful data of messages 45, 46 may be transmitted onto bus 40.

Communication control device 11 may be designed as a conventional CAN or CAN FD controller. Communication control device 11 creates and reads first messages 45, which are conventional CAN messages or CAN FD messages, for example. The conventional CAN messages are built up according to the conventional base format in which a number of up to 8 data bytes may be included in first message 45. The CAN FD message is built up according to the CAN FD format, in which a number of up to 64 data bytes may be included, which are also transferred at a much faster, and thus higher, data rate than for the conventional CAN message. Transceiver device 12 may be designed as a conventional CAN transceiver and/or a CAN FD transceiver.

Each of communication control devices 21, 31 creates and reads first messages 45 as described above, or optionally second messages 46. Second messages 46 are built up based on a format which may be referred to as a CAN FD successor format, and which, for example, may transfer data in the data phase at a higher bit rate than CAN FD. Each of transceiver devices 22, 32 may be designed as a CAN transceiver which as needed may provide one of above-described first messages 45 or a second message 46 according to the CAN FD successor format for associated communication control device 21, 31, or may receive same from the communication control device.

Formation and then transfer of messages 46 having the CAN FD successor format, and also the reception of such messages 46, are achievable by use of the two user stations 20, 30.

Figure 2:
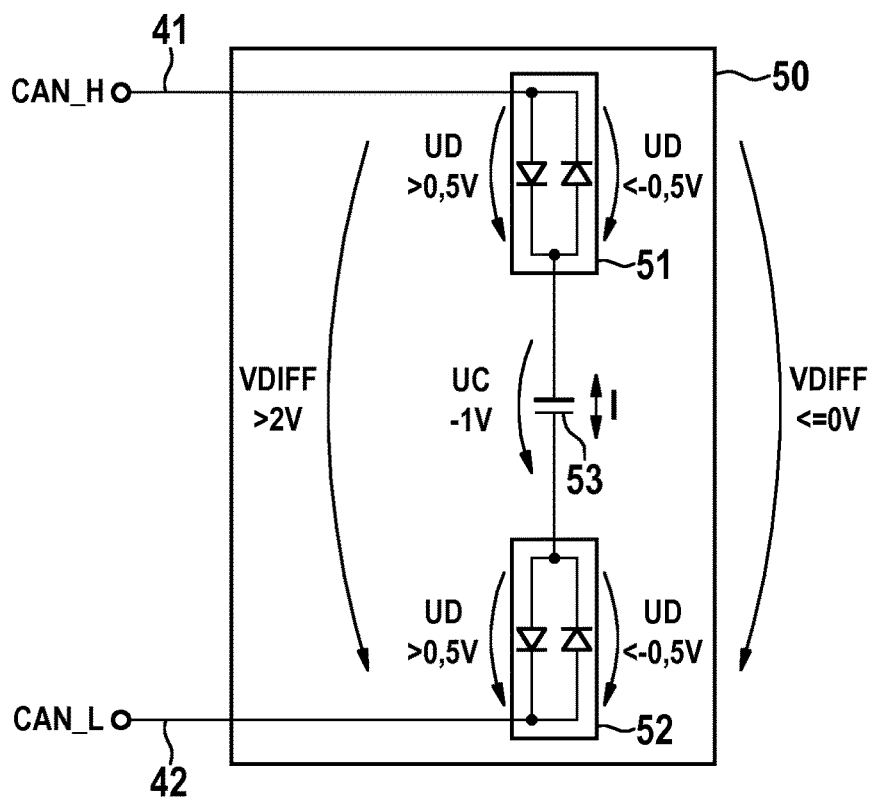
FIG. 2 shows an electrical circuit of a reflection attenuation device for the bus system according to the first exemplary embodiment of the present invention.

FIG. 2 shows an electrical circuit of reflection attenuation device 50 for bus lines 41, 42 of bus 40 according to the present exemplary embodiment.

In reflection attenuation device 50, a first antiparallel diode pair 51, a second antiparallel diode pair 52, and a capacitor 53 are connected in series at the line ends of bus lines 41, 42, in other words, between the lines for signals CAN_H and CAN_L. Capacitor 53 is connected between the two antiparallel diode pairs 51, 52.

The diodes of diode pairs 51, 52 are in each case electrical semiconductor components in which the voltage at the electrical semiconductor component remains approximately constant, regardless of the intensity of the current flow, when a predetermined threshold voltage is present that results in a current flow through the electrical semiconductor component. The threshold voltage has a value of 0.7 V, for example. After the threshold voltage is exceeded, the current through the diode may increase from approximately 0 mA to 100 mA, for example, whereas the voltage increases to only approximately 0.8 V. Of course, depending on the semiconductor, other values of the threshold voltage and the current intensity after the threshold voltage is exceeded are possible. Thus, after the threshold voltage is exceeded, the current flow through the diode or the electrical semiconductor component is not proportional to the applied voltage. This is valid in the conducting direction of the diode and also in the reverse direction of the diode.

During operation of bus system 1, a voltage UD of 0.5 volts is present in each case at the diodes of antiparallel diode pairs 51, 52, as shown in FIG. 2. As a result, capacitor 53 is charged to 1 volt by differential voltages VDIFF=CAN_H−CAN_L of 2 volts on bus 40, as likewise shown in FIG. 2. As soon as voltage UC of capacitor 53 has reached the value of 1 volt, current I no longer flows through capacitor 53 at differential voltages VDIFF between 0 volt and 2 volts. If differential voltage VDIFF increases above 2 volts, a compensating current as current I flows, which increases voltage UC at capacitor 53 and reduces differential voltage VDIFF. If differential voltage VDIFF drops below 0 volt, a compensating current as current I flows, which reduces voltage UC at capacitor 53 and increases differential voltage VDIFF.

The electrical circuit of reflection attenuation device 50 thus requires no additional voltage. Therefore, reflection attenuation device 50 may preferably be mounted at locations at which reflections arise, for example at star points, branch points, plug-in connectors, or at line ends at which no transceiver device 12, 22, 32 is connected. A branch point of bus 40 is in particular a star point or a connection of a stub for a user station 10, 20 to bus 40.

At the plug-in connectors or line ends at transceiver devices 12, 22, 32, a line termination, which is otherwise customary, which is implemented with at least one resistor may be present. However, it is of course alternatively possible for reflection attenuation device 50 to be integrated into at least one of transceiver devices 12, 22, 32.

Reflection attenuation device 50 as a whole forms a very simple electronic device which may very satisfactorily reduce the reflections at the end of bus lines 41, 42. Limiting the voltages to 0 to 2 volts is possible without the need for an additional supply voltage. At the same time, reflection attenuation device 50 is robust against short circuits of bus lines 41, 42.

Figure 3:
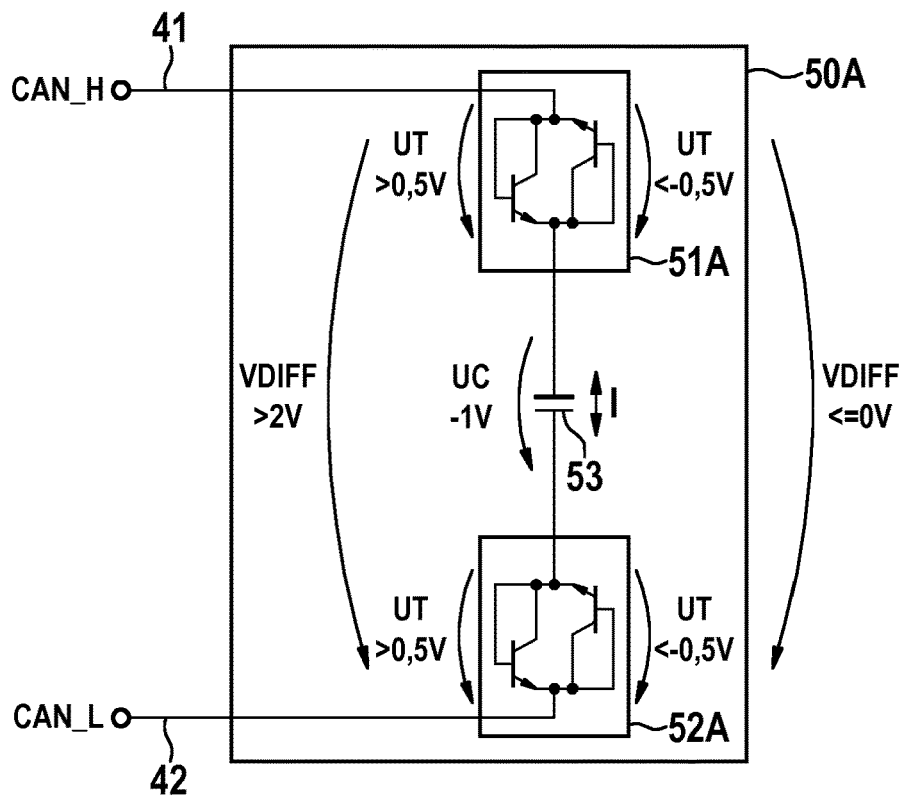
FIG. 3 shows an electrical circuit of a reflection attenuation device for a bus system according to a second exemplary embodiment of the present invention.

FIG. 3 shows an electrical circuit of a reflection attenuation device 50A that is connected to bus lines 41, 42 of bus 40 according to a second exemplary embodiment. Reflection attenuation device 50A may be used instead of at least one reflection attenuation device 50 for bus lines 41, 42 of bus 40 from FIG. 1. Bus system 1 may thus include at least one reflection attenuation device 50 and/or at least one reflection attenuation device 50A, as described above with regard to device 50.

The circuit of reflection attenuation device 50A from FIG. 3, in contrast to the circuit of reflection attenuation device 50 according to the preceding exemplary embodiment, includes antiparallel transistor pairs 51A, 52A instead of diode pairs 51, 52. In the case of bipolar transistors, for transistor pairs 51A, 52A in each case the base terminal and collector terminal of one transistor are connected to the emitter terminal of the other transistor. In the case of a field effect transistor (FET), for transistor pairs 51A, 52A in each case the gate terminal and the drain terminal of one transistor are connected to the source terminal of the other transistor. A voltage UT forms at the transistors, as shown in FIG. 3.

Transistors are also electrical semiconductor components in which the current flow through the electrical semiconductor component is not proportional to the voltages at the transistor after the threshold voltage of the transistor is exceeded. Such voltages at the transistor are present, for example, between the base terminal and the emitter terminal or between the collector terminal and the emitter terminal.

Due to the stated connection of the transistors of transistor pairs 51A, 52A, the transistors exhibit a behavior similar to that of the diodes of reflection attenuation device 50 from FIG. 2. However, the characteristic curves of the transistors of reflection attenuation device 50A in the present exemplary embodiment are steeper than those of the diodes of reflection attenuation device 50 from FIG. 2. As a result, voltages above 2 volts and below 0 volt are better limited in reflection attenuation device 50A in the present exemplary embodiment than in reflection attenuation device 50 from FIG. 2. In addition, threshold voltages different from diodes may be achieved, as the result of which differential voltages on bus 40 that are less than 2 volts may also be better limited in areas.

Figure 4:
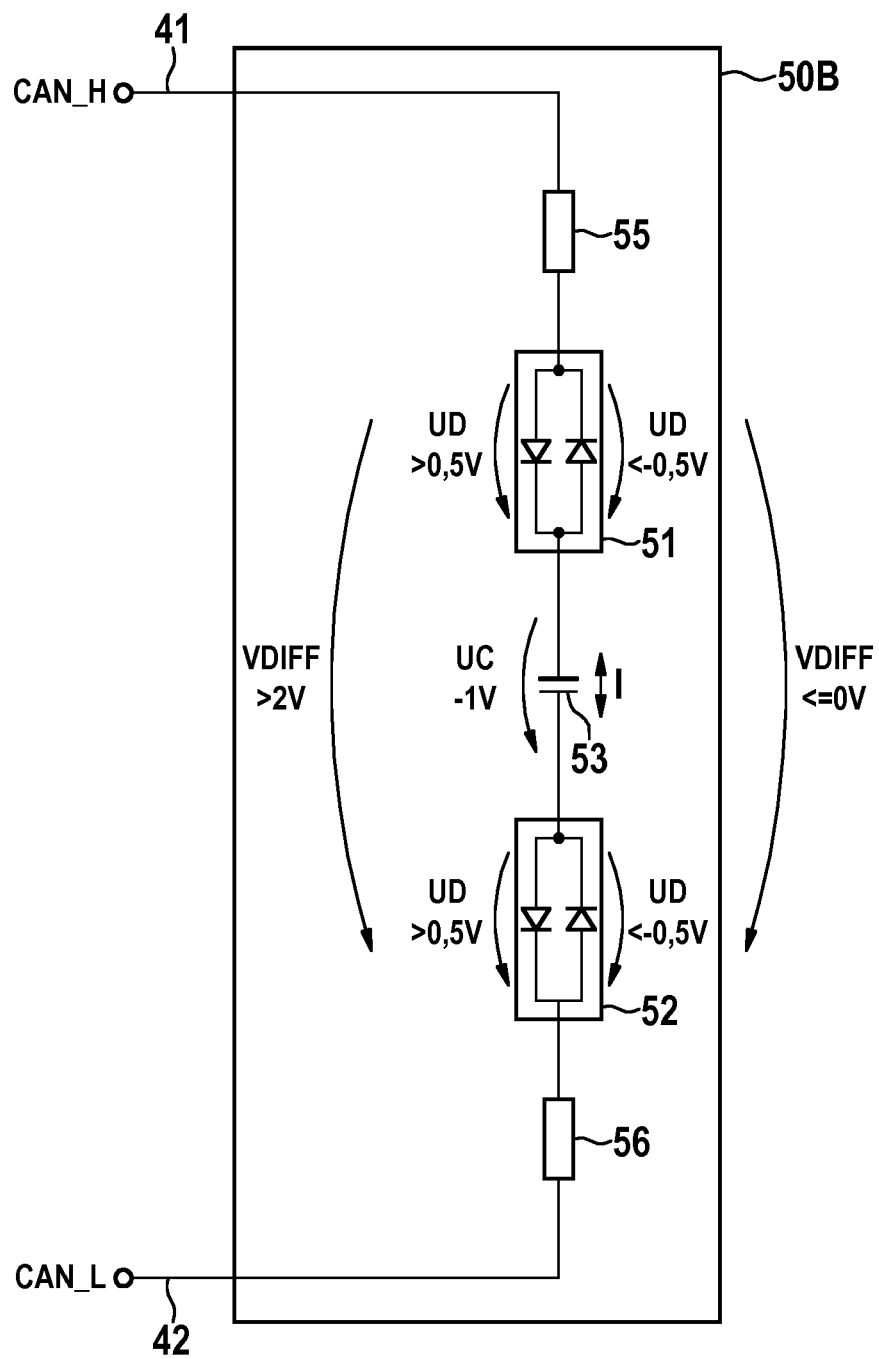
FIG. 4 shows an electrical circuit of a reflection attenuation device for a bus system according to a third exemplary embodiment of the present invention.

FIG. 4 shows an electrical circuit of a reflection attenuation device 50B that is connected to bus lines 41, 42 of bus 40 according to a third exemplary embodiment. Reflection attenuation device 50B is usable instead of at least one reflection attenuation device 50, 50A for bus lines 41, 42 of bus 40 from FIG. 1. Bus system 1 may thus include at least one of reflection attenuation devices 50, 50A, 50B as described above with regard to device 50.

For reflection attenuation device 50B, in addition to the circuit components of reflection attenuation device 50, two resistors 55, 56 are also mounted at the line ends of bus lines 41, 42, respectively. Reflection attenuation device 50 is connected between the two resistors 55, 56.

Reflection attenuation device 50B may thus be used particularly well at plug-in connections in which bus 40 is expanded by further subnetworks during operation, and as a result the circuit is sometimes mounted at the end of a stub and sometimes mounted within bus 40.

In dimensioning terminating resistors 55, 56, the ohmic behavior of diode pairs 51, 52 may be taken into account and terminating resistors 55, 56 correspondingly reduced, so that overall, the desired terminating resistance of in particular 120 ohm at voltages greater than 2 volts and less than 0 volt temporarily results.

For example, due to reflection attenuation device 50B, for a temporary voltage increase of differential voltage VDIFF=CAN_H−CAN_L from 2 volts to 2.2 volts, a current I=(2.2 V−2 V)/120 ohm=1.67 mA will flow off. For a temporary voltage decrease of differential voltage VDIFF from 0 volt to −0.2 volts, a current I=−0.2 V/120 ohm=−1.67 mA will flow off through the circuit of reflection attenuation device 50B.

According to one modification of the circuit from FIG. 4, transistor pairs 51A, 51B are provided instead of diode pairs 51, 52. In this case, reflection attenuation device 50A is connected between the two resistors 55, 56.

According to another modification of the circuit from FIG. 4, resistor 55 is connected between diode pair 51 and capacitor 53, and resistor 56 is connected between diode pair 52 and capacitor 53.

According to yet another modification of the circuit from FIG. 4, resistor 55 is connected between transistor pair 51A from FIG. 3 and capacitor 53, and resistor 56 is connected between transistor pair 51A from FIG. 3 and capacitor 54.

Figure 5:
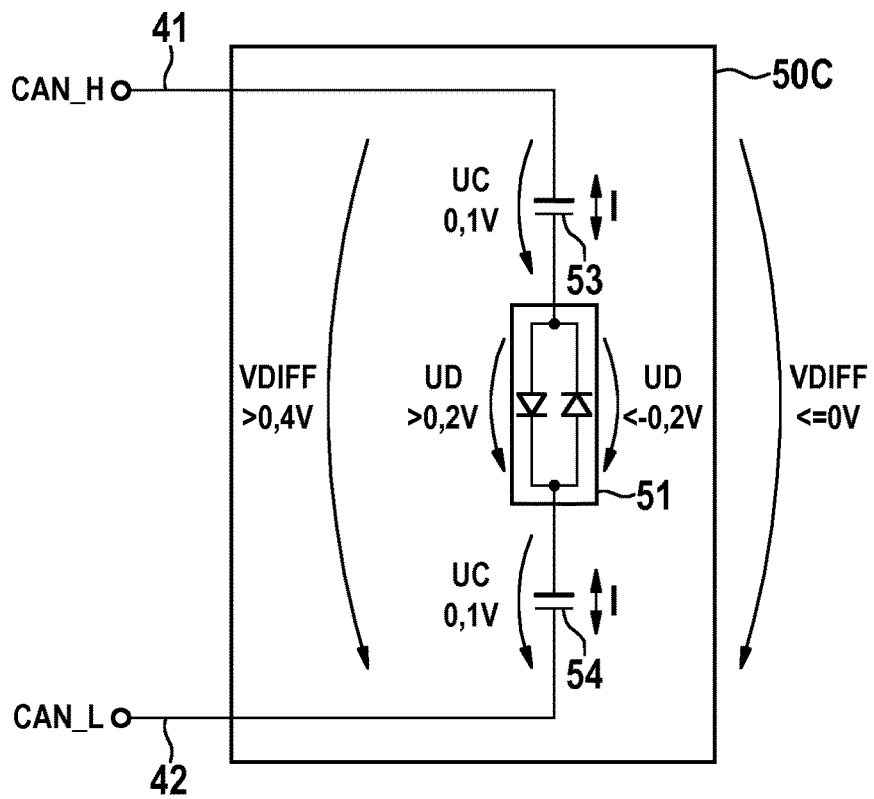
FIG. 5 shows an electrical circuit of a reflection attenuation device for a bus system according to a fourth exemplary embodiment of the present invention.

FIG. 5 shows an electrical circuit of a reflection attenuation device 50C that is connected to bus lines 41, 42 of bus 40 according to a fourth exemplary embodiment. Reflection attenuation device 50C is usable instead of at least one reflection attenuation device 50, 50A, 50B for bus lines 41, 42 of bus 40 from FIG. 1. Bus system 1 may thus include at least one of reflection attenuation devices 50, 50A, 50B, 50C, as described above with regard to device 50.

For reflection attenuation device 50C, only one antiparallel diode pair 51 is connected between two capacitors 53, 54 at the line ends of bus lines 41, 42. As a result, differential voltages VDIFF on bus 40 or between bus lines 41, 42 may be limited to values less than 2 volts.

For example, if 0.2 volt is selected as threshold voltage US of the diodes, as stated as an example in FIG. 5, differential voltages VDIFF above 0.4 volt and below 0 volt are limited. Capacitors 53, 54 are charged to greater than 0.1 volt due to voltage UD of 0.2 volt that forms at the particular diode of diode pair 51. As soon as voltages UC of capacitors 53, 54 have reached a value of 0.1 volt, at differential voltages VDIFF between 0 volt and 0.4 volt, current I no longer flows through capacitors 53, 54, provided that differential voltage VDIFF does not leave the range between 0 volt and 0.4 volt. If differential voltage VDIFF increases above 0.4 volt, a compensating current as current I flows, which reduces differential voltage VDIFF. If differential voltage VDIFF drops below 0 volt, a compensating current as current I flows, which increases differential voltage VDIFF.

According to one modification of the circuit from FIG. 5, transistor pair 51A from FIG. 2 is provided instead of diode pair 51.

According to another modification of the circuit from FIG. 5, reflection attenuation device 50C is connected between resistors 55, 56 from FIG. 4.

According to yet another modification of the circuit from FIG. 5, resistor 55 is connected between diode pair 51 and capacitor 53, and resistor 56 is connected between diode pair 51 and capacitor 54.

According to yet another modification of the circuit from FIG. 5, resistor 55 is connected between transistor pair 51A from FIG. 3 and capacitor 53, and resistor 56 is connected between transistor pair 51A from FIG. 3 and capacitor 54.

Figure 6:
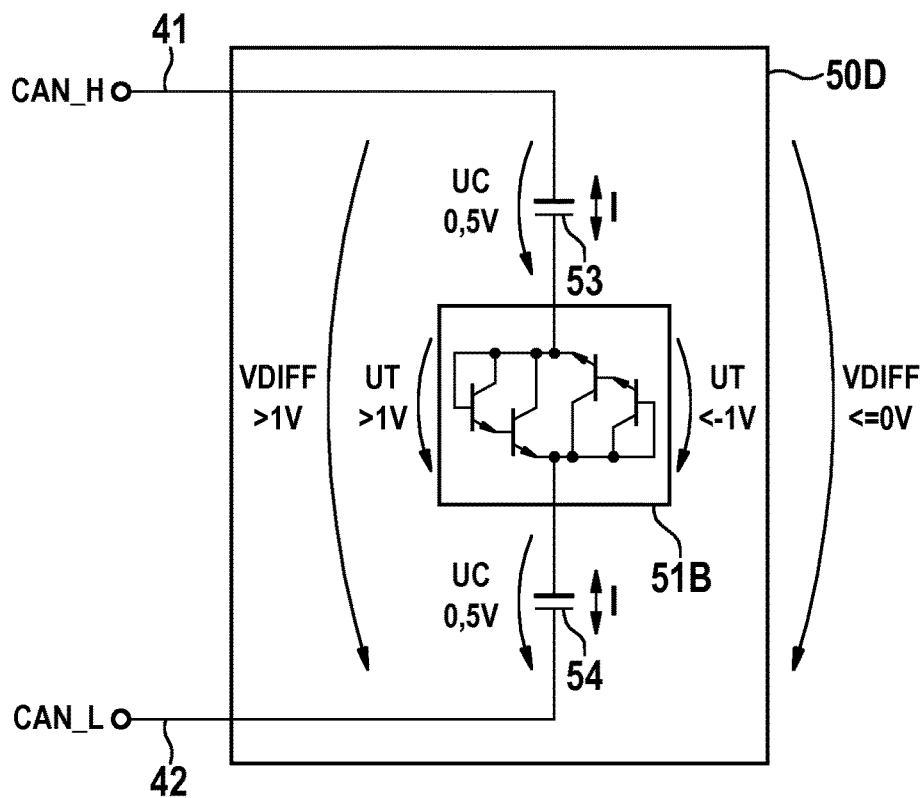
FIG. 6 shows an electrical circuit of a reflection attenuation device for a bus system according to a fifth exemplary embodiment of the present invention.

FIG. 6 shows an electrical circuit of a reflection attenuation device 50D that is connected to bus lines 41, 42 of bus 40 according to a fifth exemplary embodiment. Reflection attenuation device 50D is usable instead of at least one reflection attenuation device 50, 50A, 50B, 50C for bus lines 41, 42 of bus 40 from FIG. 1. Bus system 1 may thus include at least one of reflection attenuation devices 50, 50A, 50B, 50C, 50D, as described above with regard to device 50.

For reflection attenuation device 50D, an antiparallel Darlington transistor pair 51B is inserted between two capacitors 53, 54 at the line ends of bus lines 41, 42. In the Darlington transistors, the base terminal and the collector terminal of the transistors are connected to one another.

As a result, the characteristic curve of reflection attenuation device 50D becomes even steeper compared to reflection attenuation device 50A according to the circuit from FIG. 3 with antiparallel transistors. However, the threshold voltage for reflection attenuation device 50D also becomes greater, as the result of which the circuit may preferably be used for higher differential voltage ranges, for example 0 volt and 2 volts.

According to one modification of the present exemplary embodiment, in selecting particular Darlington transistor materials with a low threshold voltage or for limiting even higher voltages for differential voltage VDIFF, a configuration is possible in which two antiparallel Darlington transistor stage pairs 51B are connected in series to a capacitor 53. Capacitor 53 is connected between the two antiparallel Darlington transistor stage pairs 51B.

Figure 7:
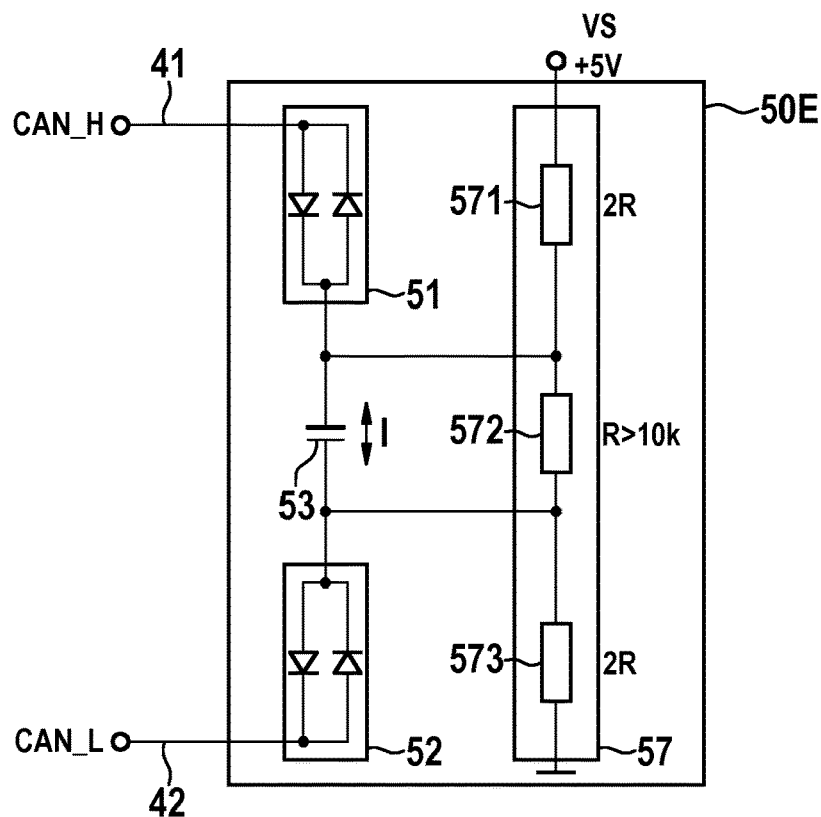
FIG. 7 shows an electrical circuit of a reflection attenuation device for a bus system according to a sixth exemplary embodiment of the present invention.

FIG. 7 shows an electrical circuit of a reflection attenuation device 50E that is connected to bus lines 41, 42 of bus 40 according to a sixth exemplary embodiment. Reflection attenuation device 50E is usable instead of at least one reflection attenuation device 50, 50A, 50B, 50C, 50D for bus lines 41, 42 of bus 40 from FIG. 1. Bus system 1 may thus include at least one of reflection attenuation devices 50, 50A, 50B, 50C, 50D, 50E, as described above with regard to device 50.

For reflection attenuation device 50E, an external voltage divider 57 that includes a series connection of resistors 571, 572, 573 is provided. The connection of resistors 571, 572 is joined to the connection of diode pair 51 and capacitor 53. The connection of resistors 572, 573 is joined to the connection of diode pair 52 and capacitor 53. Voltage divider 57 is supplied by a voltage VS, which in the shown example of CAN bus system 1 corresponds in particular to 5 V, which is established in the above-mentioned CAN protocol specification for the supply voltage (CAN supply).

External voltage divider 57 takes into account the effect of diode pairs 51, 52 and of capacitor 53, according to which, during the compensation of differential voltages VDIFF above 2 volts, the capacitor voltage increases above 1 volt, so that at a differential voltage VDIFF of greater than approximately 0 volt, a compensating current as current I already flows which initially stabilizes differential voltage VDIFF to greater than approximately 0 volt, in particular until voltage UC at capacitor 53 is once again reduced to 1 volt. If this effect is not desired, differential voltage VDIFF may then be stabilized with the aid of external voltage divider 57.

In voltage divider 57, resistance values for resistors 571, 572, 573 that are as low as possible are advisable in order to compensate for voltage deviations of ideally 1 V at capacitor 53 as quickly as possible. However, high resistance values for resistors 571, 572, 573 of voltage divider 57 are desirable in order to keep asymmetrical current feeds via voltage divider 57 low during common-mode fluctuations. As a compromise, a resistance R>10 kohm for resistor 572 may prove advantageous.

Thus, in the example from FIG. 7, the resistance values of resistors 571, 572, 573 are selected in such a way that resistor 571 has a resistance value of 2R and resistor 573 has a resistance value of 2R. In contrast, resistor 572 has a resistance value greater than 10 kohm.

Figure 8:
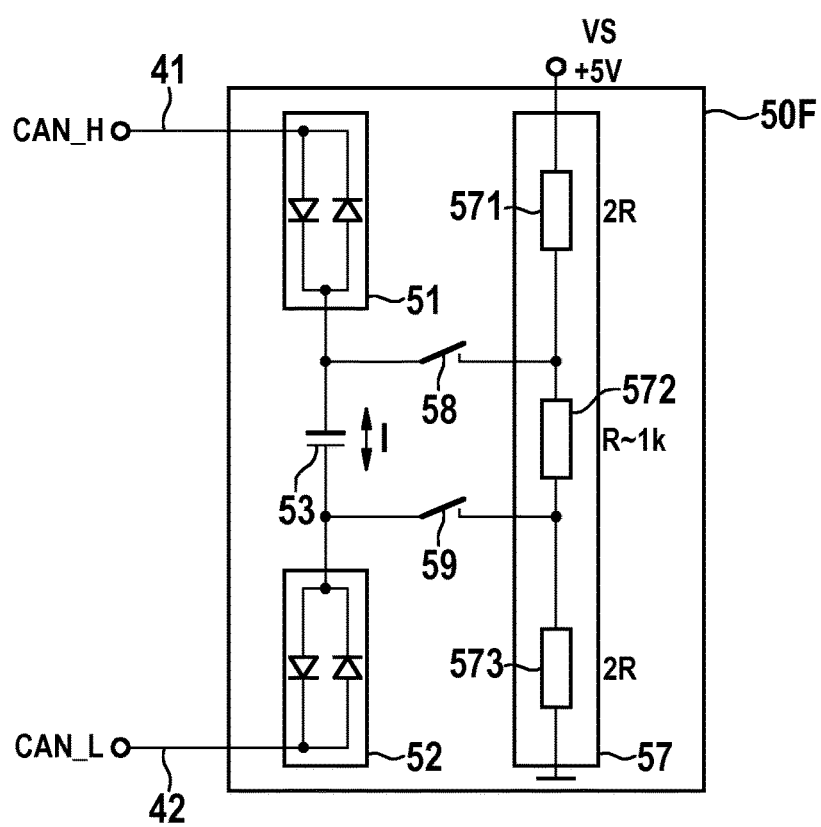
FIG. 8 shows an electrical circuit of a reflection attenuation device for a bus system according to a seventh exemplary embodiment of the present invention.

FIG. 8 shows an electrical circuit of a reflection attenuation device 50F that is connected to bus lines 41, 42 of bus 40 according to a seventh exemplary embodiment. Reflection attenuation device 50F is usable instead of at least one reflection attenuation device 50, 50A, 50B, 50C, 50D, 50E for bus lines 41, 42 of bus 40 from FIG. 1. Bus system 1 may thus include at least one of reflection attenuation devices 50, 50A, 50B, 50C, 50D, 50E, 50F, as described above with regard to device 50.

For reflection attenuation device 50F, in contrast to reflection attenuation device 50E from FIG. 7, external voltage divider 57 is switchable with the aid of switches 58, 59. As a result, resistors 571, 572, 573 act depending on the position of switches 58, 59, and influence current I at capacitor 53.

Switches 58, 59 allow the effects of high common-mode voltages to be reduced while still achieving the ideal 1 volt at capacitor 53 as quickly as possible.

For stabilizing capacitor voltage UC, voltage divider 57 is connected via switches 58, 59 only as long as the common-mode voltage is in a range around 2.5 volts, for example 2 to 3 volts, that is permissible for same. The permissible range for stabilizing voltage UC at capacitor 53 is a function of the selected resistance value for R, and thus of the selected resistance value of resistors 571, 572, 573. The difference between the currents due to the common-mode voltage is crucial for the voltage range and resistance value R. The difference must be negligibly small. In particular, approximately 1 kohm may be selected as resistance value R.

Figure 9:
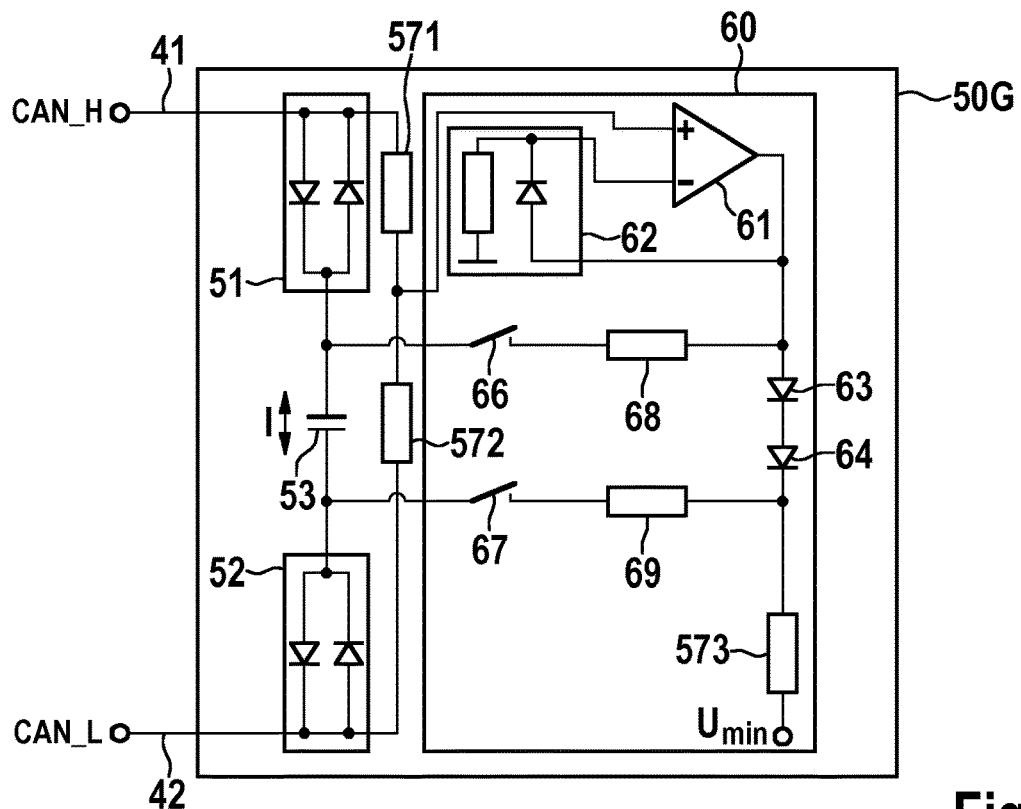
FIG. 9 shows an electrical circuit of a reflection attenuation device for a bus system according to an eighth exemplary embodiment of the present invention.

FIG. 9 shows an electrical circuit of a reflection attenuation device 50G that is connected to bus lines 41, 42 of bus 40 according to an eighth exemplary embodiment. Reflection attenuation device 50G is usable instead of at least one reflection attenuation device 50, 50A, 50B, 50C, 50D, 50E, 50F for bus lines 41, 42 of bus 40 from FIG. 1. Bus system 1 may thus include at least one of reflection attenuation devices 50, 50A, 50B, 50C, 50D, 50E, 50F, 50G, as described above with regard to device 50.

A connectable voltage source 60 is provided in reflection attenuation device 50G. By use of voltage source 60, the direct voltage range in which voltage UC at capacitor 53 may be stabilized may be increased compared to the circuit of reflection attenuation device 50F.

Voltage source 60 includes an operational amplifier 61, which at its inverting input is connected to a diode circuit 62. The inverting input is connected to the cathode of the diode of diode circuit 62. The connection between resistors 571, 572 is connected at the other input of operational amplifier 61. The anode of the diode of diode circuit 62 is connected to the output of operational amplifier 61. The diode of diode circuit 62 is thus connected into the return branch of operational amplifier 61. The output of operational amplifier 61 is also connected to a series connection of diodes 63, 64 and resistor 573. The connection or disconnection of voltage source 60 takes place via switches 66, 67 that are connected to diodes 63, 64 via resistors 68, 69.

Operational amplifier 61 with its circuitry forms an impedance converter which generates a voltage that is 0.5 volt above the mean voltage between signals CAN_H and CAN_L at bus lines 41, 42. A voltage of 1 volt forms via the two serial diodes 63, 64, as the result of which a current I flows which feeds capacitor 53 via the two resistors 68, 69 and switches 67, 68. Voltage source 60 is connected only for as long as operational amplifier 61 can drive the required voltage, and this voltage is sufficiently greater than U min.

Figure 10:
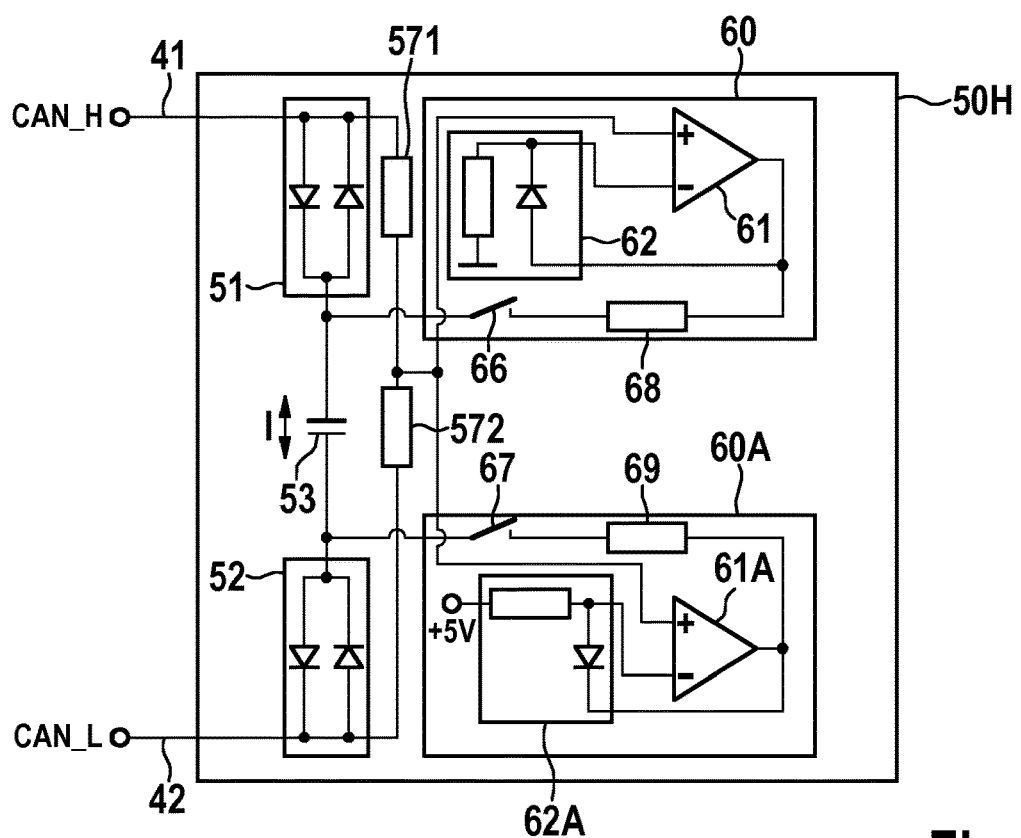
FIG. 10 shows an electrical circuit of a reflection attenuation device for a bus system according to a ninth exemplary embodiment of the present invention.

Switches 58, 59 allow the effects of high common-mode voltages to be reduced while still achieving the ideal 1 volt at capacitor 53 as quickly as possible FIG. 10 shows an electrical circuit of a reflection attenuation device 50H that is connected to bus lines 41, 42 of bus 40 according to a ninth exemplary embodiment. Reflection attenuation device 50H is usable instead of at least one reflection attenuation device 50, 50A, 50B, 50C, 50D, 50E, 50F, 50G for bus lines 41, 42 of bus 40 from FIG. 1. Bus system 1 may thus include at least one of reflection attenuation devices 50, 50A, 50B, 50C, 50D, 50E, 50F, 50G, 50H, as described above with regard to device 50.

For reflection attenuation device 50H, in contrast to reflection attenuation device 50G according to FIG. 9, two connectable voltage sources 60, 60A designed as impedance converters are provided. Second connectable voltage source 60A includes an operational amplifier 61A, which at its inverting input is connected to a diode circuit 62A. The inverting input of operational amplifier 61A is connected to the anode of the diode of diode circuit 62A. The connection between resistors 571, 572 is connected to the other input of operational amplifier 61A. The cathode of the diode of diode circuit 62A is connected to the output of operational amplifier 61A. The diode of diode circuit 62A is thus connected into the return branch of operational amplifier 61A. The output of operational amplifier 61A is also connected to resistor 69, so that voltage source 60A is connectable or disconnectable via switch 67.

Operational amplifier 61 with its circuitry forms an impedance converter which generates a voltage that is 0.5 volt above the mean voltage between signals CAN_H and CAN_L at bus lines 41, 42. In contrast, operational amplifier 61A with its circuitry forms an impedance converter which generates a voltage that is 0.5 volt below the mean voltage. As a result, the voltage at capacitor 53 becomes 1 volt. Impedance converters or operational amplifiers 61, 61A are connected only for as long as the common-mode voltage is in a range that is tolerated by operational amplifiers 61, 61A, i.e., for as long as operational amplifiers 61, 61A can still operate with sufficient accuracy.

By use of reflection attenuation devices 50, 50A, 50B, 50C, 50D, 50E, 50F, 50G, 50H described above, in each case the reflections on bus lines 41, 42 may be attenuated, and common-mode interferences or differential-mode interferences may be effectively led off.

All of the above-described embodiments of reflection attenuation devices 50, 50A, 50B, 50C, 50D, 50E, 50F, 50G, 50H, of user stations 10, 20, 30, of transceiver devices 12, 22, 32, of bus system 1, and of the method carried out therein may be used alone or in any possible combination. In particular, all features of the above-described exemplary embodiments and/or modifications thereof may be arbitrarily combined. Additionally or alternatively, in particular the following modifications are possible.

It is possible for one of the described circuits of reflection attenuation devices 50, 50A, 50B, 50C, 50D, 50E, 50F, 50G, 50H to be integrated into one of transceiver devices 12, 22, 32. This is meaningful in particular when transceiver device 12, 22, 32, as is often common, is situated at one end of bus lines 41, 42, and reflections may arise here. Such a design and integration of reflection attenuation devices 50, 50A, 50B, 50C, 50D, 50E, 50F, 50G, 50H into one of transceiver devices 12, 22, 32 are also advantageous due to the fact that structures that are already present, for example for detecting the direct voltage, are reusable.

Although reflection attenuation devices 50, 50A, 50B, 50C, 50D, 50E, 50F, 50G, 50H are described with regard to the CAN bus system, the present invention is not limited thereto. Reflection attenuation devices 50, 50A, 50B, 50C, 50D, 50E, 50F, 50G, 50H of the exemplary embodiments and their modifications are usable in all branched bus systems, i.e., not just in CAN and CAN FD networks. Similarly, the described circuits are usable for branched bus systems without differential signal transfer, such as Local Interconnect Network (LIN), Serial Peripheral Interface (SPI), or Inter-Integrated Circuit (I$^2$C) (bus for device-internal communication).

Above-described bus system 1 according to the exemplary embodiments is described with reference to a bus system based on the CAN protocol. However, bus system 1 according to the exemplary embodiments may also be some other type of communications network in which data are serially transferable at two different bit rates. It is advantageous, but not a mandatory requirement, that in bus system 1, exclusive, collision-free access of a user station 10, 20, 30 to a shared channel is ensured, at least for certain time periods.

The number and arrangement of user stations 10, 20, 30 in bus system 1 of the exemplary embodiments is arbitrary. In particular, user station 10 in bus system 1 may be dispensed with. It is possible for one or more of user stations 20 or 30 to be present in bus system 1.

What is claimed is:

1. A reflection attenuation device for a bus of a bus system, comprising:
   at least one pair of electrical semiconductor components connected in parallel; and
   at least one capacitor that is connected in series to the at least one pair of electrical semiconductor components connected in parallel, for attenuating reflections on a bus line of the bus;
   wherein the at least one pair of electrical semiconductor components connected in parallel includes two diodes connected antiparallel, and
   wherein the at least one capacitor includes at least two capacitors, and wherein a pair of the at least one pair the at least one electrical semiconductor components connected in parallel is connected between two capacitors of the at least two capacitors.

2. The reflection attenuation device as recited in claim 1, further comprising:
   at least one connectable voltage source that includes an impedance converter.

3. A reflection attenuation device for a bus of a bus system, comprising:
   at least one pair of electrical semiconductor components connected in parallel; and
   at least one capacitor that is connected in series to the at least one pair of electrical semiconductor components connected in parallel, for attenuating reflections on a bus line of the bus;
   wherein the at least one pair of electrical semiconductor components includes at least two pairs of electrical semiconductor components connected in parallel, and wherein a capacitor of the at least one capacitor is connected between two pairs of the at least two electrical semiconductor components connected in parallel.

4. A reflection attenuation device for a bus of a bus system, comprising:
   at least one pair of electrical semiconductor components connected in parallel; and at least one capacitor that is connected in series to the at least one pair of electrical semiconductor components connected in parallel, for attenuating reflections on a bus line of the bus;

wherein the at least one pair of electrical semiconductor components connected in parallel includes two transistors that are in particular connected antiparallel, and: (i) the transistors are bipolar transistors in which in each case a base terminal and a collector terminal of one of the transistors are connected to an emitter terminal of the other of the transistors, or (ii) the transistors are field effect transistors in which in each case a gate terminal and a drain terminal of one of the transistors are connected to a source terminal of the other of the transistors.

5. A reflection attenuation device for a bus of a bus system, comprising:
at least one pair of electrical semiconductor components connected in parallel;
at least one capacitor that is connected in series to the at least one pair of electrical semiconductor components connected in parallel, for attenuating reflections on a bus line of the bus; and
a voltage divider connected in parallel to the series connection of the at least one pair of electrical semiconductor components connected in parallel and the at least one capacitor;
wherein the voltage divider is connected to a switching device for connecting or disconnecting the voltage divider.

6. A reflection attenuation device for a bus of a bus system, comprising:
at least one pair of electrical semiconductor components connected in parallel;
at least one capacitor that is connected in series to the at least one pair of electrical semiconductor components connected in parallel, for attenuating reflections on a bus line of the bus; and
a voltage divider connected in parallel to the series connection of the at least one pair of electrical semiconductor components connected in parallel and the at least one capacitor;
wherein the voltage divider includes three resistors that are connected to one another in series, a middle resistor of the three resistors of the voltage divider being connected in parallel to the capacitor, the middle resistor having a resistance value that is one-half a resistance value of the other two resistors of the three resistors of the voltage divider, and the resistance value of the middle resistor being greater than 10 kohm or 1 kohm.

7. A reflection attenuation device for a bus of a bus system, comprising:
at least one pair of electrical semiconductor components connected in parallel;
at least one capacitor that is connected in series to the at least one pair of electrical semiconductor components connected in parallel, for attenuating reflections on a bus line of the bus, wherein the at least one capacitor includes at least two capacitors, and wherein a pair of the at least one pair the at least one electrical semiconductor components connected in parallel is connected between two capacitors of the at least two capacitors; and
at least one connectable voltage source that includes an impedance converter;

wherein the impedance converter includes an operational amplifier at whose output a series connection of two diodes is connected, and the series connection of two diodes connected in parallel to the one capacitor.

8. A user station for a bus system, comprising:
a transceiver device configured to transmit messages onto a bus of the bus system and/or to receive messages from the bus of the bus system;
a reflection attenuation device, including:
at least one pair of electrical semiconductor components connected in parallel, and
at least one capacitor that is connected in series to the at least one pair of electrical semiconductor components connected in parallel, for attenuating reflections on a bus line of the bus; and
a communication control device to generate and transmit messages to the transceiver device and to receive and evaluate messages from the transceiver device, the communication control device being configured to generate the messages so that in a first communication phase for transmitting the messages onto the bus, it is negotiated, between user stations of the bus system, which of the user stations in a subsequent second communication phase has, at least temporarily, exclusive, collision-free access to the bus of the bus system.

9. The user station as recited in claim 8, wherein a line termination is integrated into the transceiver device.

10. A bus system, comprising:
a bus; and
at least two user stations that are connected to one another via the bus in such a way that they may communicate serially with one another; and
at least one reflection attenuation device, including:
at least one pair of electrical semiconductor components connected in parallel, and
at least one capacitor that is connected in series to the at least one pair of electrical semiconductor components connected in parallel, for attenuating reflections on a bus line of the bus;
wherein the at least one pair of electrical semiconductor components connected in parallel includes two diodes connected antiparallel, and
wherein the at least one capacitor includes at least two capacitors, and wherein a pair of the at least one pair the at least one electrical semiconductor components connected in parallel is connected between two capacitors of the at least two capacitors.

11. The bus system as recited in claim 10, wherein: (i) the at least one reflection attenuation device is connected to a branch point of the bus, (ii) the at least one reflection attenuation device closes off a free end of the bus, or (iii) at least one of the user stations a transceiver device is configured to transmit messages onto a bus of the bus system or to receive messages from the bus of the bus system, and the at least one reflection attenuation device.

12. A method for attenuating reflections during a data transfer in a bus system, the method comprising:
transmitting a message in the bus system via a bus, to whose at least one bus line a reflection attenuation device that includes at least one pair of electrical semiconductor components connected in parallel, and at least one capacitor, connected in series to the at least one pair of electrical semiconductor components connected in parallel, is connected; and
attenuating reflections on a bus line of the bus, using the reflection attenuation device;

wherein the at least one pair of electrical semiconductor components connected in parallel includes two diodes connected antiparallel, and wherein the at least one capacitor includes at least two capacitors, and wherein a pair of the at least one pair the at least one electrical semiconductor components connected in parallel is connected between two capacitors of the at least two capacitors.

\* \* \* \* \*